United States Patent
Li et al.

(10) Patent No.: US 10,162,234 B2
(45) Date of Patent: Dec. 25, 2018

(54) DISPLAY PANEL AND DISPLAY MODULE

(71) Applicant: BOE TECHNOLOGY GROUP CO., LTD., Beijing (CN)

(72) Inventors: Wenqi Li, Beijing (CN); Wei Qin, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 732 days.

(21) Appl. No.: 14/382,005

(22) PCT Filed: Nov. 6, 2013

(86) PCT No.: PCT/CN2013/086610
§ 371 (c)(1),
(2) Date: Aug. 29, 2014

(87) PCT Pub. No.: WO2015/024299
PCT Pub. Date: Feb. 26, 2015

(65) Prior Publication Data
US 2016/0291378 A1 Oct. 6, 2016

(30) Foreign Application Priority Data
Aug. 19, 2013 (CN) .......................... 2013 1 0362183

(51) Int. Cl.
G02F 1/1345 (2006.01)
G02F 1/133 (2006.01)
(Continued)

(52) U.S. Cl.
CPC ........ *G02F 1/13452* (2013.01); *G02F 1/1345* (2013.01); *G02F 1/13306* (2013.01);
(Continued)

(58) Field of Classification Search
CPC ............. G02F 1/13452; G02F 1/13306; G02F 1/133308; G02F 1/133514; G02F 1/1345; H01L 25/0652; H01L 27/124
(Continued)

(56) References Cited

U.S. PATENT DOCUMENTS 6,343,030 B1* 1/2002 Higuchi .................. G11C 5/04
257/E23.079
7,253,865 B2* 8/2007 Battersby ............ G02F 1/13336
257/293
(Continued)

FOREIGN PATENT DOCUMENTS

CN 1517762 A 8/2004
CN 1540396 10/2004
(Continued)

OTHER PUBLICATIONS

Office Action in Chinese Patent Application No. 201310362183.7, dated Nov. 12, 2015.
(Continued)

*Primary Examiner* — Ori Nadav
(74) *Attorney, Agent, or Firm* — Brooks Kushman P.C.

(57) ABSTRACT

The present invention relates to a display panel and a display module, the display panel comprises a display region and a non-display region, and boundaries between the display region and the non-display region comprise at least one arc structure. The technical effects of the present invention are that it is beneficial to design a display module with an arc and narrow frame, which greatly reduces the range of the frame, increases the area that can be displayed, it is more consistent with the natural display contour of the human eye's physiology, with more comfortable, natural and fantastic display effect.

9 Claims, 7 Drawing Sheets

(51) Int. Cl.
*G02F 1/1333* (2006.01)
*G02F 1/1335* (2006.01)
*H01L 25/065* (2006.01)
*H01L 27/12* (2006.01)

(52) U.S. Cl.
CPC .. *G02F 1/133308* (2013.01); *G02F 1/133514* (2013.01); *H01L 25/0652* (2013.01); *H01L 27/124* (2013.01); *G02F 2001/133317* (2013.01); *G02F 2201/56* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 8,159,644 | B2* | 4/2012 | Takatori | G02F 1/134336 349/146 |
| 8,378,928 | B2* | 2/2013 | Ogasawara | G02F 1/136286 345/55 |
| 8,658,436 | B2* | 2/2014 | Yamada | H01L 22/34 257/E21.531 |
| 9,165,833 | B2* | 10/2015 | Grivna | H01L 21/30655 |
| 2003/0126524 | A1* | 7/2003 | Kashihara | G01R 31/318541 714/718 |
| 2005/0078267 | A1* | 4/2005 | Motomatsu | G02F 1/1339 349/190 |
| 2006/0077191 | A1* | 4/2006 | Ming-Daw | G02F 1/133351 345/204 |
| 2008/0012794 | A1* | 1/2008 | Battersby | G02F 1/1345 345/55 |
| 2008/0048934 | A1* | 2/2008 | Yamamoto | G02F 1/13454 345/55 |
| 2008/0266210 | A1* | 10/2008 | Nonaka | G09G 3/20 345/55 |
| 2009/0115933 | A1* | 5/2009 | Mimura | G02F 1/133512 349/59 |
| 2010/0214195 | A1* | 8/2010 | Ogasawara | G02F 1/136286 345/55 |
| 2011/0194063 | A1* | 8/2011 | Lee | G02F 1/1333 349/153 |
| 2011/0304969 | A1 | 12/2011 | Kwon et al. | |
| 2015/0355768 | A1* | 12/2015 | Kuwahara | G06F 3/0412 345/157 |
| 2016/0240157 | A1* | 8/2016 | Aoki | G09G 3/3666 |

FOREIGN PATENT DOCUMENTS

| | | |
|---|---|---|
| CN | 1659614 | 8/2005 |
| CN | 101295081 | 10/2008 |
| CN | 101577071 | 11/2009 |
| CN | 101726927 | 6/2010 |
| CN | 101849255 | 9/2010 |
| JP | 2008046307 | 2/2008 |

OTHER PUBLICATIONS

Office Action in Chinese Patent Application No. 201310362183.7, dated Apr. 25, 2016.
Office Action in Chinese Patent Application No. 201310362183.7, dated Nov. 7, 2016.
Office Action issued in corresponding Chinese Application No. 2013103621837 dated May 15, 2015.
International Search Report and Written Opinion issued in corresponding International Application No. PCT/CN2013/086610 dated Jun. 9, 2014.

* cited by examiner

DISPLAY PANEL AND DISPLAY MODULE

CROSS-REFERENCE TO RELATED APPLICATION

This application is the U.S. national phase of PCT Application No. PCT/CN2013/086610 filed on Nov. 6, 2013, which claims priority to Chinese Patent Application No. 201310362183.7 filed on Aug. 19, 2013, the disclosures of which are incorporated in their entirety by reference herein.

TECHNICAL FIELD

The present invention relates to the field of the liquid crystal display, especially relates to an arc display panel and a display module.

BACKGROUND

A display module comprises a display panel and a frame. The display panel is formed by cell alignment of an array substrate and a color film substrate. The array substrate comprises a central region (corresponding to a display region of the display panel) and a peripheral wiring region (corresponding to a non-display region of the display panel). The central region comprises gate lines and data lines made in crossed arrangement, and thin film transistors and pixel electrodes in the pixel region which is defined by the gate lines and the data lines. The peripheral wiring region comprises a gate drive chip connected to the gate lines and a source gate drive chip connected to the data lines.

With the rapid development of liquid crystal display technology and the constant improvement of people's living standards and aesthetic appeals, more and more attentions are paid to the appearance and the display effect of the display module. Currently, the appearance of the display module is generally rectangular structure, the gate lines and the data lines are made by linear wiring, thus the appearance structure is dull, and the response time of the edge region of the display area is slow.

SUMMARY

To solve the above mentioned problems, the embodiments of the present invention provide a display panel and a display module to make the display effect more comfortable and natural.

To achieve the above object, the technical solution of an embodiment of the present invention provides a display panel, the display panel comprises a display region and a non-display region, and boundaries between the display region and the non-display region comprise at least one arc structure.

Further, the boundaries comprise two opposite first boundaries and two opposite second boundaries, the first boundaries are constructed in an arc structure, and the second boundaries are constructed in a linear structure.

Further, the display panel comprises an array substrate and a color film substrate, and the shapes of regions in the array substrate and the color filter substrate corresponding to the display region are the same as or corresponding to the shape of the display region.

Further, the array substrate comprises a central region corresponding to the display region and a peripheral wiring region corresponding to the non-display region, the central region comprises gate lines and data lines which are made in crossed arrangement to define pixel regions, and pixels in the pixel regions that are near the arc structure are arranged in accordance with the arc structure.

Further, the gate lines and the data lines define the pixel regions as several lines, and two ends of the several lines of the pixel regions that are respectively near the corresponding arc structure of the first boundaries are in an arc shape.

Further, in a direction parallel to the second boundaries, the length of the several lines of the pixel regions are gradually increased from the second boundaries to the top of the arc structure of the first boundaries, and in a direction vertical to the second boundaries, the length of the pixel regions are gradually decreased from the top of the arc structure of the first boundaries to two ends of the first boundaries, to form an arc structure corresponding to the arc structure of the first boundaries.

Further, the peripheral wiring region comprises a gate drive chip connected to the gate lines and a source drive chip connected to the data lines, and the wiring structures of the gate lines and the data lines in the peripheral wiring region are arc structures.

Further, the gate drive chip is provided corresponding to the first boundaries, the gate drive chip provided corresponding to the arc structure comprises arc edges disposed oppositely and linear edges disposed oppositely, and the linear edges are provided parallel to the second boundaries.

Further, the arc edges match the first boundaries of the display region.

Further, the surrounding of the gate drive chip is provided with pins connected with the gate lines, the pins on the arc edges away from the first boundaries extend outwardly along the direction parallel to the second boundaries, and the connection lines of the corresponding pins on the linear edges provided oppositely are constructed in an arc structure corresponding to the shapes of the arc edges.

Further, the pins on the arc edges adjacent to the first boundaries extend along a direction away from the center of the arc edges.

Further, the arc edges adjacent to the first boundaries are divided into a first region and a second region by its central point, the pins in the first region which is located above the central point are inclined upward, and the pins in the second region which is located below the central point are inclined downward.

An embodiment of the present invention provides a display module, comprising: a display panel and a frame, wherein the display panel is the one as mentioned above, and the shapes of the inner boundaries of the frame match the shapes of the boundaries of the display region.

Further, the shapes of the outer boundaries of the frame match the shapes of the boundaries of the display region.

Further, the outer boundaries of the frame comprises third boundaries which are provided oppositely and fourth boundaries which are provided oppositely, the third boundaries and the fourth boundaries are both constructed in a linear structure, and a part connecting the third boundaries and the fourth boundaries that are adjacent is constructed in a round corner structure.

Further, the part connecting the third boundaries and the fourth boundaries that are adjacent is provided with a function key.

Further, the outer boundaries of the frame comprise third boundaries which are provided oppositely and constructed in a linear shape and fourth boundaries which are provided oppositely and constructed in an arc structure, and the fourth boundaries are constructed by a linear structure and arc structures connected to two ends of the linear structure.

The technical effects of the embodiments of the present invention are that it is beneficial to design a display module with an arc and narrow frame, which greatly reduces the range of the frame, increases the area that can be displayed, it is more consistent with the natural display contour of the human eye's physiology, with more comfortable, natural and fantastic display effect.

DETAILED DESCRIPTION

Figure 1:
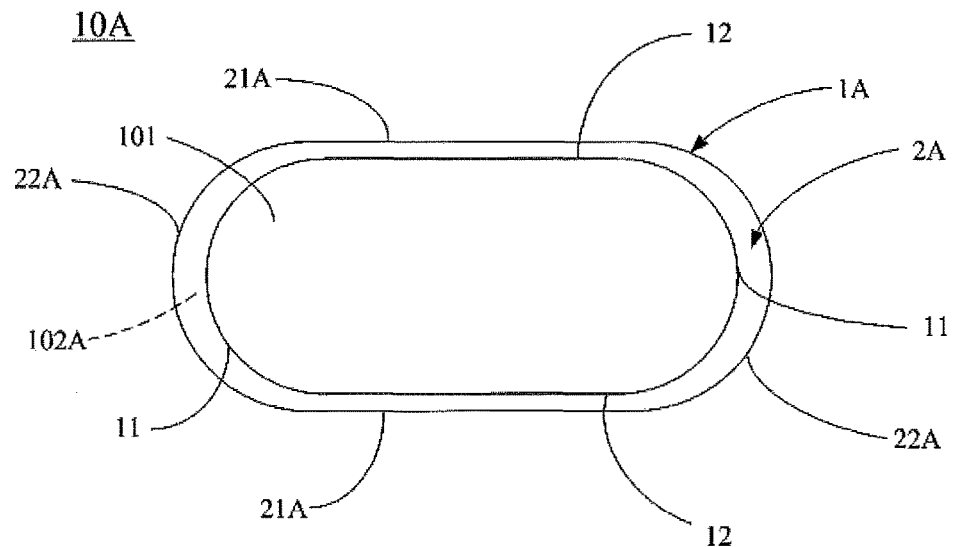
FIG. 1 shows a plan view of a display module 10A in the first embodiment of the present invention.

The structure and the principle of the present invention will be described in detail referring to the drawings, and the listed embodiments are only for explaining the present invention, not for the limitation of the protection scope of the present invention.

A First Embodiment

As shown in FIG. 1, in this embodiment, a display panel 1A comprises a display region 101 and a non-display region 102A, and boundaries between the display region 101 and the non-display region 102A comprise at least one arc structure (first boundaries 11).

The boundaries of the display region 101 of the display panel 1A comprises one arc structure, which is beneficial to design a display module 10A with an arc and narrow frame, greatly reduce the range of the frame, increase the area that can be displayed, and be more consistent with the natural display contour of the human eye's physiology, with more comfortable, natural and fantastic display effect.

The boundaries between the display region 101 and the non-display region 102A comprise two opposite first boundaries 11 and two opposite second boundaries 12. The first boundaries 11 are constructed in an arc structure, and the second boundaries 12 are constructed in a linear structure.

The arc structure can be formed by semicircular, excellent arc, inferior arc, and so on, the curvature of the arc structure can be set according to actual needs.

In this embodiment, the first boundaries 11 are constructed in an arc structure, and the center of the first boundaries 11 is the top of the arc structure. Hereafter, taking the arc structural as the first boundaries 11 as an example to describe the display panel 1A of this embodiment.

The display module 10A of this embodiment comprises the display panel 1A and a frame 2A, and the shapes of the inner boundaries of the frame 2A match the shapes of the boundaries (the first boundaries 11 and the second boundaries 12) of the display region 101.

The shapes of the outer boundaries of the frame 2A also match the boundaries (the first boundaries 11 and the second boundaries 12) of the display region 101, and the outer boundaries of the frame 2A comprise third boundaries 21A which are provided oppositely and constructed in a linear shape, and fourth boundaries 22A which are provided oppositely and constructed in an arc structure.

Figure 12:
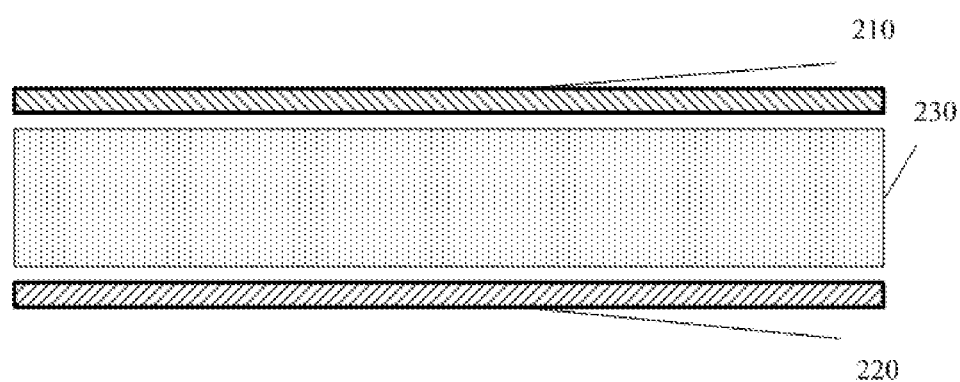
FIG. 12 shows a view of a color film substrate and an array substrate of a display panel with a liquid crystal layer between the color film substrate and the array substrate.

In addition, the display panel 1A comprises an array substrate 220 and a color film substrate 210, which are shown in FIG. 12, and the shapes of boundaries of regions in the array substrate 220 and the color film substrate 210 corresponding to the display region are the same as the shapes of the boundaries of the display region.

Figure 2:
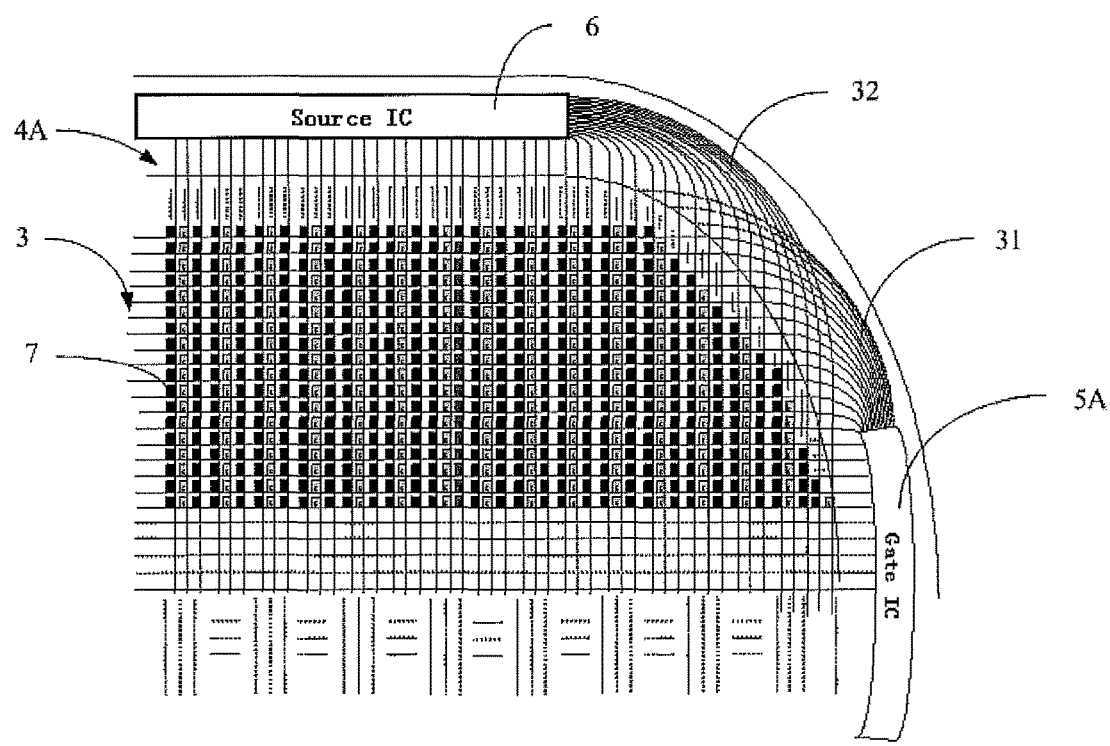
FIG. 2 shows a schematic view of an array substrate in the first embodiment of the present invention.

As shown in FIG. 2, the array substrate comprises a central region 3 corresponding to the display region 101 (see FIG. 1) and a peripheral wiring region 4A corresponding to the non-display region 102A (see FIG. 1). The central region 3 comprises gate lines 31 and data lines 32 which are made in crossed arrangement to define pixel regions 7, and pixels in the pixel regions 7 that are near the arc structure are arranged in accordance with the arc structure.

Figure 3:
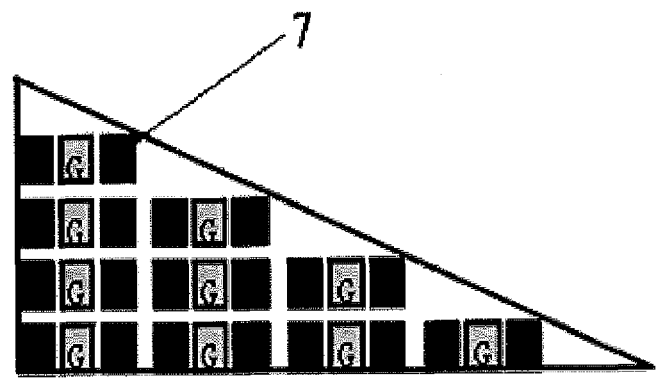
FIG. 3 shows a partial enlarged view of a pixel region in the first embodiment of the present invention.

In order to adapt the arc structural form of the first boundaries 11 of the display region 101 in the display panel 1A (see FIG. 1), pixels in the pixel regions 7 near the first boundaries 11 are arranged in accordance with the arc structure and formed in the stepped structure so as to form smooth display boundaries as shown in FIG. 3.

As shown in FIGS. 1 and 2, the gate lines 31 and the data lines 32 define the pixel regions 7 as several lines. Two ends of the several lines of pixel regions 7 that are respectively near the corresponding arc structure of the first boundaries 11 are in an arc shape. Here, FIG. 2 only shows a part of the right end of the pixel regions 7. In a direction parallel to the second boundaries 12, the length of the several lines of the pixel regions 7 are gradually increased from the second boundaries 12 the top of the arc structure of the first boundaries 11. In a direction vertical to the second boundaries 12, the length of the pixel regions 7 are gradually decreased from the top of the arc structure of the first boundaries 11 to two ends of the first boundaries 11, to form an arc structure corresponding to the arc structure of the first boundaries 11.

The peripheral wiring region 4A comprises a gate drive chip 5A connected to the gate lines 31 and a source drive chip 6 connected to the data lines 32, and the wiring structures of the gate lines 31 and the data lines 32 in the peripheral wiring region 4A are arc structures.

The wiring structures of the gate lines 31 and the data lines 32 is arc, which ensures that the frame presents aesthetic arc design; while comparing with the linear alignment of the conventional rectangular panels, this structure shorts the route, reduces the impedance of the gate lines and the data lines, and greatly reduces the RC delay, thus it decreases the possibility that the response time of the boundaries region in the display is slow, especially in the large-sized display, and it is beneficial to design the display module with the arc and narrow frame.

The source drive chip 6 is constructed in rectangular structure and provided corresponding to the second boundaries 12, and the gate drive chip 5A is provided corresponding to the first boundaries 11.

Figure 4:
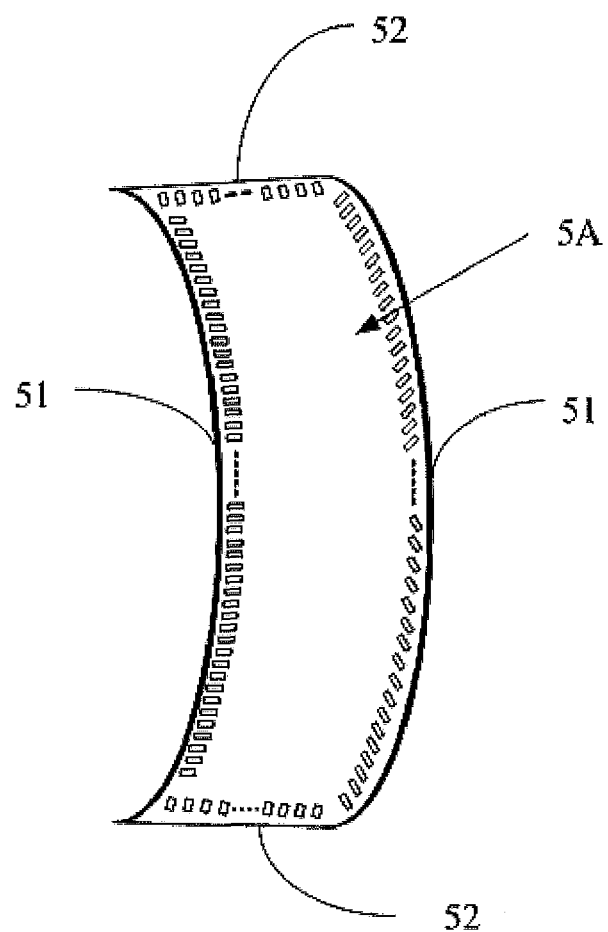
FIG. 4 shows a schematic view of a gate drive chip 5A in the first embodiment of the present invention.

As shown in FIG. 4, the gate drive chip 5A has arc edges 51 provided oppositely and linear edges 52 provided oppositely. In here, arc edges 51 match the first boundaries 11 (see FIG. 1) of the display region 101, and linear edges 52 are provided parallel to the second boundaries 12 (see FIG. 1) of the display region 101.

Since the gate drive chip 5A is constructed in an arc structure corresponding to the first boundaries 11 (see FIG. 1), it is more fit to the arc display boundaries between the display region 101 and the non-display region 102A of the display panel 1A (see FIG. 1) and the outlook of frame 2A including the arc structure. Therefore, it can further compress the frame and be more beneficial to design the display module with the arc and narrow frame.

The design of the appearance of gate drive chip 5A avoids the restrictions on the frame 2A including the arc structure from the prior art gate drive chip 5A constructed in regular rectangular structure, and it is more beneficial to design the display module 10A with the narrow frame.

In addition, the surrounding of the gate drive chip 5A is provided with pins connected with the gate lines 31, the pins on the arc edges 51 away from the first boundaries 11 (see FIG. 1) extend outwardly along the direction parallel to the second boundaries 12 (see FIG. 1), and the connection lines of the corresponding pins on the linear edges 52 provided oppositely are constructed in an arc structure corresponding to the shapes of the arc edges 51.

The setting of the pins is beneficial to the wiring of the gate lines 31.

The pins on the arc edges 51 adjacent to the first boundaries 11 extend along a direction away from the center of the arc edges 51.

Besides, the arc edges 51 adjacent to the first boundaries 11 are divided into a first region and a second region by its central point, the pins in the first region which is located above the central point are inclined upward, and the pins in the second region which is located below the central point are inclined downward.

Although in this embodiment the gate drive chip 5A is constructed in an arc structure and the source drive chip 6 is constructed in rectangular structure, it is not limitation. It can also make the source drive chip 6 to be constructed in an arc structure and the gate drive chip 5A to be constructed in rectangular structure.

In this embodiment, the whole outer boundaries of the display panel 1A comprises at least one arc structure, and the shape of the connecting portion between the frame 2A and the display panel 1A is the same as the shapes of the outer boundaries of the display panel 1A, the shapes of the outer boundaries of the frame 2A is the same as the shapes of the outer boundaries of the display panel 1A. Correspondingly, the parts in the array substrate 220 and the color film substrate 210, which form the display panel 1A, corresponding to the arc structure are in an arc shape, and a liquid crystal layer 230 between the array substrate 220 and the color film substrate 210 are also distributed in accordance with the shapes of the array substrate 220 and the color film substrate 210.

A Second Embodiment

In the second embodiment, the same parts as the first embodiment use the same reference signs, and the detailed description is omitted. Compared with the first embodiment, a display module 10B of this embodiment has differences in the shape of a non-display region 102E of a display panel 1B, the shape of a frame 2B and the shape of a gate drive chip 5B.

Figure 5:
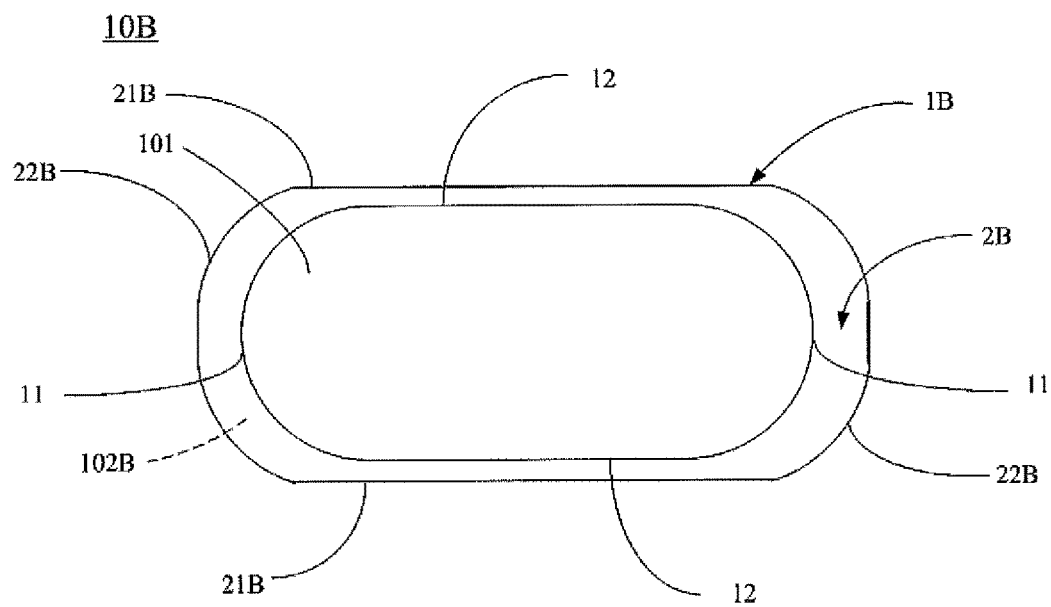
FIG. 5 shows a plan view of a display module 10B in the second embodiment of the present invention.
Figure 6:
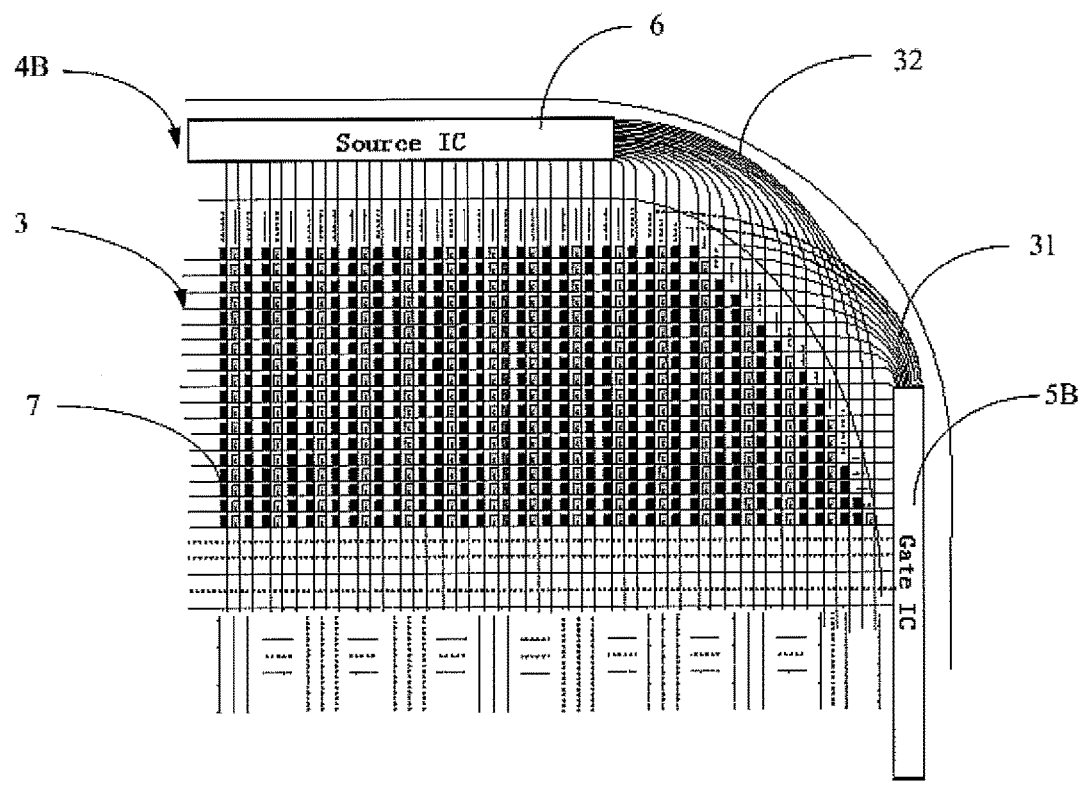
FIG. 6 shows a schematic view of an array substrate in the second embodiment of the present invention.

As shown in FIG. 5 and FIG. 6, in this embodiment, the display module 10B comprises a display panel 1B and a frame 2B, and boundaries between the display region 101 and the non-display region 102B of the display panel 1B comprise at least one arc structure (first boundaries 11).

As shown in FIG. 5, since the shape of the non-display region 102B is the same as the shape of the frame 2B, just taking the frame 2B as an example to explain as bellow.

The shapes of the inner boundaries of the frame 2B match the shapes of the boundaries between the display region 101 and the non-display region 102B.

The outer boundaries of the frame 2B comprise third boundaries 21B which are provided oppositely and constructed in a linear shape and fourth boundaries 22B which are provided oppositely and constructed in an arc structure. Different from the first embodiment, the fourth boundaries 22B in the second embodiment are constructed by a linear structure and arc structures connected to two ends of the linear structure.

As shown in FIG. 6, a gate drive chip 5B that is configured in the peripheral wiring region 4B corresponding to the shape of the frame 2B is constructed in rectangular structure.

A Third Embodiment

In the third embodiment, the same parts as the first embodiment use the same reference signs, and the detailed description is omitted.

Figure 7:
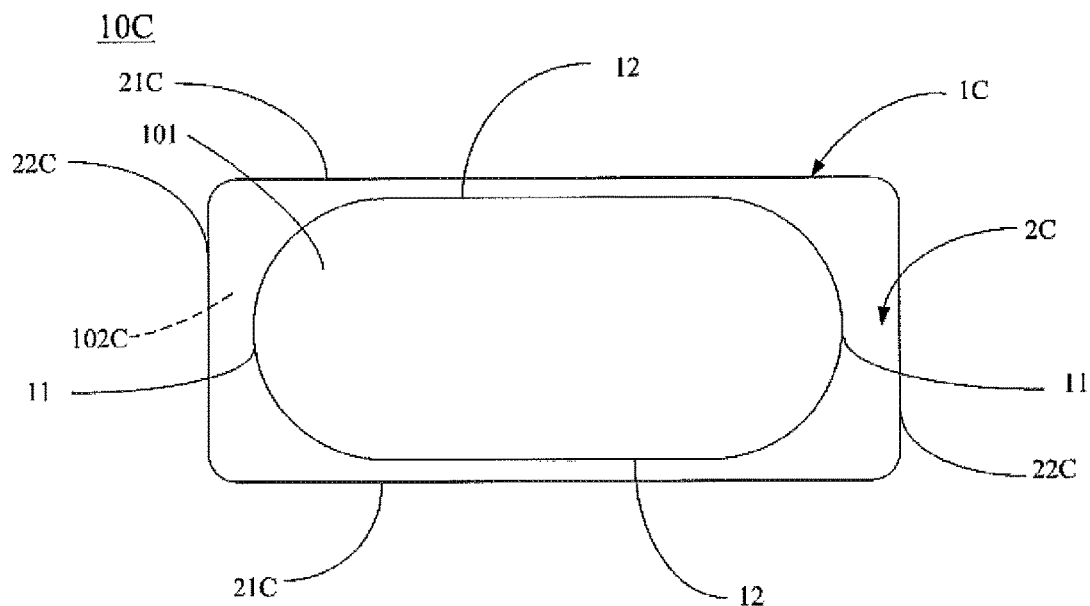
FIG. 7 shows a plan view of a display module 10C in the third embodiment of the present invention.
Figure 8:
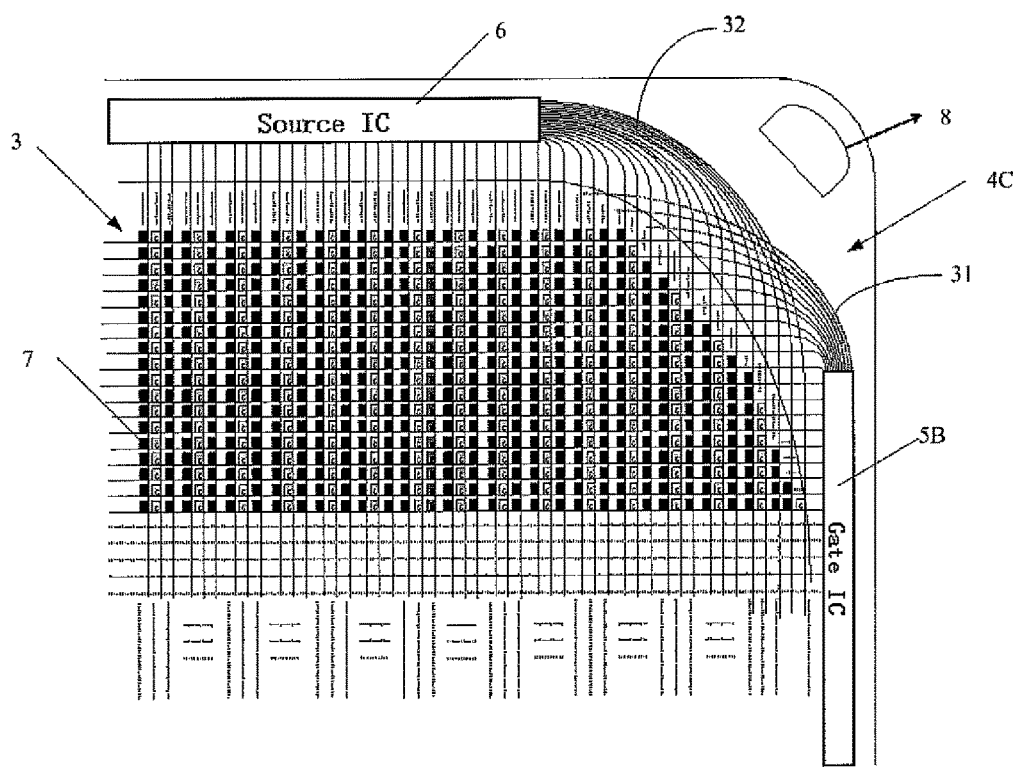
FIG. 8 shows a schematic view of an array substrate in the third embodiment of the present invention.

As shown in FIG. 7 and FIG. 8, in this embodiment, the display module 10C comprises a display panel 1C and a frame 2C, and boundaries between the display region 101 and the non-display region 102C of the display panel 1C comprise at least one arc structure (first boundaries 11).

The shapes of the inner boundaries of the frame 2C match the shapes of the boundaries between the display region 101 and the non-display region 102C.

The outer boundaries of the frame 2C comprise third boundaries 21C which are provided oppositely and fourth boundaries 22C which are provided oppositely, both of the third boundaries 21C and the fourth boundaries 22C are constructed in a linear structure, and a part connecting the third boundaries 21C and the fourth boundaries 22C that are adjacent is constructed in a round corner structure.

Also, the part connecting the third boundaries 21C and the fourth boundaries 22C that are adjacent is provided with a function key 8, which makes full use of the space and is beneficial to design the narrow frame.

The display panel 1C comprises an array substrate, and the array substrate comprises a central region 3 corresponding to the display region 101 and a peripheral wiring region 4C. The central region 3 comprises gate lines 31 and data lines 32 which are make in crossed arrangement to define pixel regions 7, and pixels in the pixel regions 7 that are near the arc structure are arranged in accordance with the arc structure.

In order to adapt the arc structural form of the first boundaries 11 of the display region 101 in the display panel 1C, pixels in the pixel regions 7 near the first boundaries 11 are arranged in accordance with the arc structure and formed in stepped structure so as to forms smooth display boundaries (see FIG. 3).

The gate lines 31 and the data lines 32 define the pixel regions 7 as several lines. Two ends of the several lines of pixel regions that are respectively near the corresponding arc structure of the first boundaries 11 are in an arc shape. In a direction parallel to the second boundaries 12, the length of the several lines of pixel regions 7 are gradually increased from the second boundaries 12 the top of the arc structure of the first boundaries 11.

In this embodiment, the top of the arc structure is located in the center of the first boundaries 11 for aesthetic appearance, thus the length of the pixel regions in a direction parallel to the second boundaries 12 are gradually increased from the second boundaries 12 to the center of the first boundaries 11. But the structure of the first boundaries 11 is not limited to this, the top of the arc structure formed on the first boundaries 11 can be selected on two sides of the center of the first boundaries 11, and the first boundaries 11 can also form more than two arc structures.

The peripheral wiring region 4C comprises a gate drive chip 5B connected to the gate lines 31 and a source drive chip 6 connected to the data lines 32, and the wiring structures of the gate lines 31 and the data lines 32 in the peripheral wiring region 4C are arc structures.

The wiring structures of the gate lines 31 and the data lines 32 are arc structures, which ensures that the frame presents aesthetic arc design; while comparing with the linear alignment of the conventional rectangular panels, this design shorts the route, reduces the impedance of the gate lines and the data lines, and greatly reduces the RC delay, thus it decreases the possibility that the response time of the boundaries region in the display is slow, especially in the large-sized display, and it is beneficial to design the display module with the arc and narrow frame.

The gate drive chip 5B is provided corresponding to the first boundaries 11, and the source drive chip 6 is provided corresponding to the second boundaries 12. Both of the source drive chip 6 and the gate drive chip 5B are constructed in rectangular structure.

The Application of the Display Module

Figure 9:
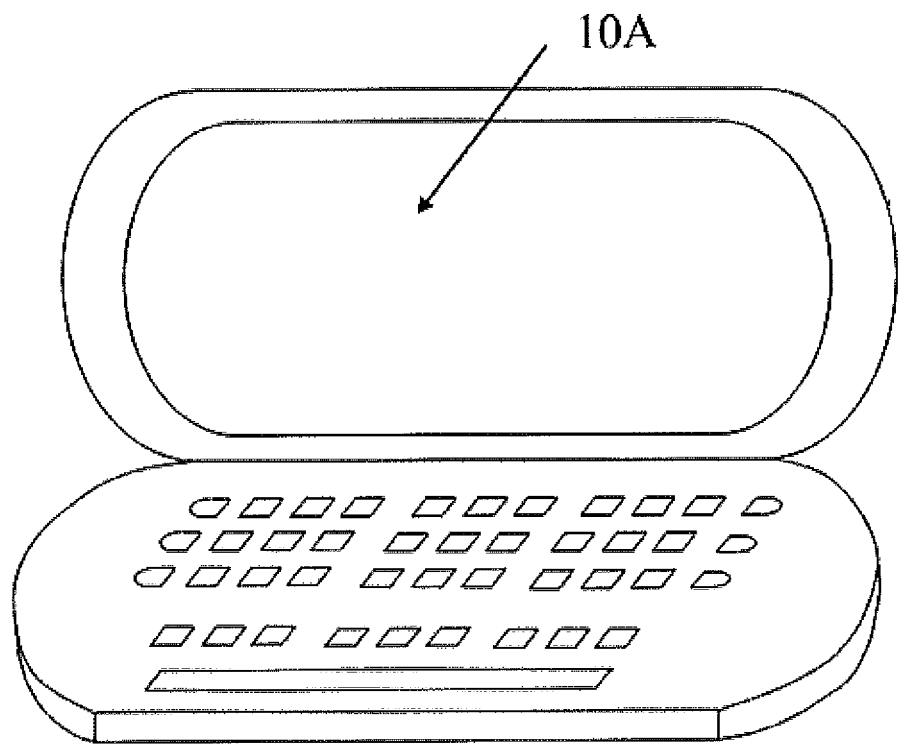
FIG. 9 shows the application of the display module 10A of the present invention on the notebook computers.
Figure 10:
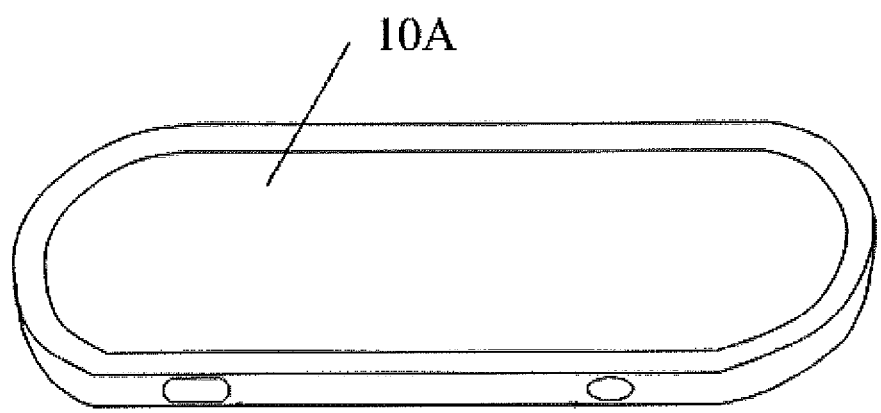
FIG. 10 shows the application of the display module 10A of the present invention on the mobile phone.
Figure 11:
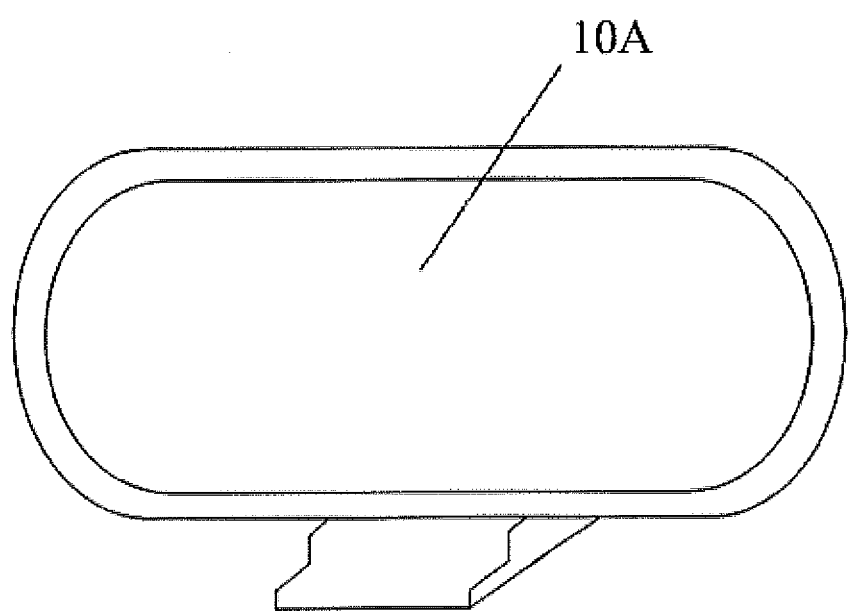
FIG. 11 shows the application of the display module 10A of the present invention on TV.

FIG. 9 shows the application of the display module 10A of the present invention on the notebook computers; FIG. 10 shows the application of the display module 10A of the present invention on the mobile phone; FIG. 11 shows the application of the display module 10A of the present invention on TV.

The frame becomes narrow to make the area that can be displayed increase, which is more consistent with the natural display contour of the human eye's physiology, with more comfortable, natural and fantastic display effect.

The described above are only the preferred embodiments of the present invention, it should be pointed out that, it can be made some improvements and embellish on the premise of without departing from the principle thereof by those skilled in the art, these improvements and embellish should be seen as the protection scope of the present invention as well.

What is claimed is:

1. A display panel, comprising:
   a display region,
   a non-display region, and
   boundaries located between the display region and the non-display region and comprising two opposite first boundaries and two opposite second boundaries,
   wherein the display panel further comprises an array substrate, a color film substrate, and a liquid crystal layer between the array substrate and the color film substrate,
   the array substrate comprises a central region corresponding to the display region and a peripheral wiring region corresponding to the non-display region, the central region comprises gate lines and data lines which are made in a crossed arrangement to define pixel regions, the peripheral wiring region comprises at least one gate drive chip connected to the gate lines and at least one source drive chip connected to the data lines,
   each of the at least one gate drive chip has four edges comprising two arc edges disposed oppositely and two linear edges disposed oppositely, each of the four edges is provided with a plurality of pins connected with the gate lines, and the pins on one arc edge of the two arc edges are arranged to extend along a direction away from a center of the arc edge,
   the two opposite first boundaries are constructed in an arc structure, and the two opposite second boundaries are constructed in a linear structure,
   shapes of regions in the array substrate and the color film substrate corresponding to the display region are the same as or corresponding to a shape of the display region,
   pixels in the pixel regions that are near the arc structure are arranged in accordance with the arc structure,
   wiring structures of the gate lines and the data lines in the peripheral wiring region are arc structures,
   the at least one gate drive chip is provided corresponding to the first boundaries, and the two linear edges are provided parallel to the second boundaries,
   the pins on one arc edge of the two arc edges adjacent to the first boundaries extend outwardly along the direction parallel to the second boundaries, and connection lines of corresponding pins on the two linear edges provided oppositely are constructed in an arc structure corresponding to shapes of the two arc edges, and
   the other arc edge of the two arc edges away from the first boundaries are divided into a first region and a second region by a central point of the arc edge, pins in the first region which is located above the central point are inclined upwardly, and pins in the second region which is located below the central point are inclined downwardly.

2. The display panel according to claim 1, wherein the gate lines and the data lines define the pixel regions as several lines, and two ends of the several lines of the pixel regions that are respectively near the corresponding arc structure of the first boundaries are in an arc shape.

3. The display panel according to claim 2, wherein in a direction parallel to the second boundaries, a length of each of the several lines of the pixel regions gradually increases from the second boundaries to the top of the arc structure of the first boundaries, and in a direction vertical to the second boundaries, a length of each row of pixels in the pixel regions gradually decreases from the top of the arc structure of the first boundaries to two ends of the first boundaries, to form an arc structure corresponding to the arc structure of the first boundaries.

4. The display panel according to claim 1, wherein the two arc edges match the first boundaries of the display region.

5. A display module, comprising:
   a display panel according to claim 1, and
   a frame, wherein shapes of inner boundaries of the frame match shapes of the boundaries of the display region.

6. The display panel according to claim 5, wherein shapes of outer boundaries of the frame match the shapes of the boundaries of the display region.

7. The display panel according to claim 5, wherein the outer boundaries of the frame comprise third boundaries which are provided oppositely and fourth boundaries which are provided oppositely, the third boundaries and the fourth boundaries are both constructed in a linear structure, and a part connecting the third boundaries and the fourth boundaries that are adjacent is constructed in a round corner structure.

8. The display panel according to claim 7, wherein the part connecting the third boundaries and the fourth boundaries that are adjacent is provided with a function key.

9. The display panel according to claim 5, wherein the outer boundaries of the frame comprise third boundaries which are provided oppositely and constructed in a linear shape and fourth boundaries which are provided oppositely and constructed in an arc structure, and the fourth boundaries are constructed by a linear structure and arc structures connected to two ends of the linear structure.

* * * * *